United States Patent

Yamada et al.

Patent Number: 6,113,718
Date of Patent: *Sep. 5, 2000

[54] METHOD FOR MANUFACTURING A SOLAR CELL MODULE HAVING PHOTOVOLTAIC CELL SANDWICHED BETWEEN COVERING MATERIALS

[75] Inventors: Satoru Yamada, Kyoutanabe; Takahiro Mori, Ikoma; Ichiro Kataoka, Kyoutanabe; Hidenori Shiotsuka; Ayako Shiotsuka, both of Nara, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/999,144

[22] Filed: Dec. 29, 1997

[51] Int. Cl.$^7$ ................................................. H01L 31/048
[52] U.S. Cl. .......................... 156/78; 136/251; 156/285; 156/286
[58] Field of Search .............................. 156/78, 285, 286, 156/297; 136/251, 244; 257/433

[56] References Cited

U.S. PATENT DOCUMENTS 5,800,631  9/1998  Yamada et al. ........................ 136/251

FOREIGN PATENT DOCUMENTS 8-116082  5/1996  Japan .

Primary Examiner—Jeff H. Aftergut
Attorney, Agent, or Firm—Fitzpatrick, Cella, Harper & Scinto

[57] ABSTRACT

A method for manufacturing a solar cell module including a photovoltaic cell between a surface covering material and a back-surface covering material is disclosed that includes the steps of sequentially laminating a member elastically deformable in the direction of the thickness and a member having a flexural rigidity on the surface covering material and/or the back-surface covering material, and providing an external pressure to the member having the flexural rigidity to cover the photovoltaic cell with the surface covering material and the back-surface covering material. According to the above-described manufacturing method, by providing the member elastically deformable in the direction of the thickness, it is possible to prevent deformation and breakage of the photovoltaic cell and rupture of the covering materials. Furthermore, by utilizing a property such that hardness changes in accordance with an amount of deformation, possesed by the member which is deformed in the direction of the thickness, foaming of a foamed member can be homogenized. In addition, since the pressure is provided via the member having the flexural rigidity, the surfaces of the covering materials of the solar cell module are not deformed more than the amount of deformation of the member which is elastically deformed in the direction of the thickness. As a result, large undulation does not occur in the solar cell module.

11 Claims, 4 Drawing Sheets

A-A" CROSS SECTION

METHOD FOR MANUFACTURING A SOLAR CELL MODULE HAVING PHOTOVOLTAIC CELL SANDWICHED BETWEEN COVERING MATERIALS

BACKGROUND OF THE INVENTION

1. Field of the Invention

The present invention relates to a method for manufacturing a solar cell module. More particularly, the invention relates to a method for manufacturing a solar cell module in which undulation of the laminate, defects in external appearance, and the like caused by deformation or breakage of a photovoltaic cell, rupture of covering materials, and unevenness in a foamed member can be prevented.

2. Description of the Related Art

A solar cell module, obtained by covering a photovoltaic cell with a resin and bonding a foamed member on the back surface of the cell, has been known as a solar cell module which can be carried outdoors and which can be used for outdoor activities and the like. Such a solar cell module having a bonded foamed member can even float on water.

Conventionally, solar cell modules which can be used for outdoor activities and the like have been manufactured according to a method in which a foamed member is bonded after laminating members to an insulator. In this method however, two processes, i.e., a process of laminating the members with insulator and a process of bonding the foamed member, are required. In order to manufacture a solar cell module with lower cost, simplification of these processes is required.

A solar cell module, in which a back-surface lid member having a space with an amorphous-silicon-type solar cell panel is mounted on a surface opposite to a photosensing surface of the solar cell panel, and a foaming synthetic resin is filled in the space formed between the solar cell panel and the back-surface lid member, has been proposed (Japanese Patent Laid-Open Application (Kokai) No. 8-116082 (1996)). It is claimed that, according to such a configuration, a temperature for recovering or suppressing photodegradation in an amorphous-silicon-type solar cell can be maintained.

There are various methods for covering an amorphous-silicon thin-film photovoltaic cell. For example, a method of using a plastic film, instead of a glass plate, as a surface covering material, and a method of using a steel plate or the like as a back-surface covering material, when intending to provide rigidity, have been known. A method of using a single-vacuum-type chamber in a process for covering a photovoltaic cell with such a member has been proposed. In this method, an O-ring is provided on a laminator plate, and evacuation is performed using a rubber plate or the like. A description will now be provided of a process of covering a photovoltaic cell with a surface covering material and a back-surface covering material using a single-vacuum-type chamber.

There are two methods, i.e., a face-up method and a face-down method, in a process for covering a photovoltaic cell with a surface covering material and a back-surface covering material.

In the face-up method, a back-surface covering material, a photovoltaic cell and a surface covering material are laminated in this sequence on a laminator plate having an O-ring. After mounting silicone rubber or the like on this structure, the inside surrounded by the laminator plate, the O-ring and the silicone rubber are vacuum-heated. Then, the entire structure is placed in an oven heated to a predetermined temperature and is heated for a predetermined time period. The face-down method differs from the face-up method only in that the sequence of lamination of the covering materials and the photovoltaic cell are inverse to the sequence in the face-up method.

One of these two methods can be selected in consideration of various conditions, such as the shape of the photovoltaic cell, the thicknesses of the covering materials, projections and recesses on components to be mounted, and selection of a surface for which smoothness is required. For example, when projections on the surface of the photovoltaic cell are large and the surface covering material is thin, the face-up method is selected. On the other hand, when the surface covering material is sufficiently thick and projections on the surface of the photovoltaic cell are large, the face-down method may also be adopted. In the face-down method, since the metal plate of a jig presses the surface of the solar cell module, the surface of the solor cell module is smoothed. On the other hand, in the face-up method, since the surface of the solar cell module is pressed by the silicone rubber or the like, the surface of the solar cell module follows the shape of the surface of the photovoltaic cell.

Problems when foaming an unfoamed member in the covering process

It has become clear that the following problems arise when using the above-described single-vacuum-type laminating device in a process in which an unfoamed member is included in the back-surface covering material. In the process, the photovoltaic cell is covered with the surface covering material and the back-surface covering material, and a foamed member is formed at the back surface side of the photovoltaic cell.

That is, in the face-down method, since a lid member, comprising silicone rubber or the like, used as a jig has a low flexural rigidity (i.e., is flexible), a central portion of the silicone rubber tends to be stretched due to pressure during foaming if an unfoamed member is foamed while fixing the end portions of the silicone rubber. As a result, the foamed member present at a central portion of the solar cell module contains a greater amount of foam, thereby causing inhomegeneity.

On the other hand, in the face-up method, since the foamed member can be pressed with the photovoltaic cell, a homogeneous foamed member can be obtained in a portion below the photovoltaic cell. However, the expansion of the generated foams differs between a portion where the photovoltaic cell is present and a portion where the photovoltaic cell is absent. Hence, it is necessary to solve this problem.

Problem of deformation of the photovoltaic cell in the covering process

Currently, the covering material of the solar cell is being made thinner in order to reduce the cost of the solar cell module. For this reason, the covering process according to the above-described face-up method is preferably used.

However, when covering the photovoltaic cell having projections on the back surface according to this method, the photovoltaic cell, during the covering process, is pressed following the projections on the back surface, resulting in deformation or even destruction of the photovoltaic cell.

Problem of nonuniform foaming

In the unfoamed member, a foaming agent contained therein is subjected to thermal decomposition to form a foamed member after the resin is heated and melts.

When covering the photovoltaic cell according to the face-up method, the unfoamed member flows while being heated and melted, so that the amount of the resin in portions corresponding to the projections of the back surface of the photovoltaic cell decreases. Even if the foaming agent decomposes in this state, a foamed member is not formed in these portions because the amount of the resin is very small. Accordingly, the formed foamed member becomes nonuniform. This nonuniform foaming causes depressions in the back surface of the solar cell module.

In the face-up method, by providing a lamination base during the covering process which has a shape conforming to the back surface of the photovoltaic cell, it is possible to prevent the flow of the resin and the deformation of the photovoltaic cell. However, since the obtained solar cell module is partially protruded, this approach is not preferable from the viewpoint of external appearance. Furthermore, when moving the solar cell module outdoors, the protruded portions tend to be selectively abraded, thereby causing breakage of the covering material.

Although the problem of the flow of the resin can be solved by causing the silicone rubber to follow the unfoamed member by adopting the face-down method, the above-described nonuniform foaming between central portions and end portions occurs. If pressure is provided by inserting a member having a high flexural rigidity between the silicone rubber and the unfoamed member, defects occur in the external appearance due to the resin flow.

Problem of undulation of lamination materials

When the expansion of generated foams differs and the thickness of the solar cell module partially changes, the surface of the solar cell module is undulated, resulting in the formation of defects in external appearance. Particularly, in the case of lamination materials using an unfoamed member, since the expansion of generated foams greatly differs between portions where the photovoltaic cell is present and portions where the photovoltaic cell is absent, undulation of the surface covering material and/or the back-surface covering material tends to occur.

SUMMARY OF THE INVENTION

It is an object of the present invention to provide a solar cell module in which, even when covering a photovoltaic cell having projections and recesses, deformation and breakage of the photovoltaic cell, rupture of covering materials, and the like do not occur, undulation of the solar cell module due to nonuniformity in the expansion of generated foams of a foamed member is very small, and defects in the external appearance due to nonuniform foaming do not occur.

According to one aspect, the present invention, which achieves the above-described object, relates to a method for manufacturing a solar cell module including a photovoltaic cell between a surface covering material and a back-surface covering material. The method includes the steps of sequentially laminating a member elastically deformable in the direction of the thickness of the members and a member having a flexural rigidity, on the surface covering material and/or the back-surface covering material, and exerting a pressure on the member having the flexural rigidity to cover the photovoltaic cell with the surface covering material and the back-surface covering material.

According tb the above-described manufacturing method, by providing the member elastically deformable in the direction of the thickness, it is possible to prevent deformation and breakage of the photovoltaic cell and rupture of the covering materials. Furthermore, by utilizing a property such that hardness changes in accordance with an amount of deformation, possessed by the member which is deformed in the direction of the thickness, foaming of a foamed member can be homogenized. In addition, since the pressure is provided via the member having the flexural rigidity, the surfaces of the covering materials of the solar cell module are not deformed more than the amount of deformation of the member which is elastically deformed in the direction of the thickness. As a result, large undulation does not occur in the solar cell module.

By providing a reinforcing plate or a back-surface film on the backmost surface of the back-surface covering material, and providing an unfoamed member having a resin and a foamed member between the reinforcing plate or the back-surface film and the photovoltaic cell, and simultaneously heating and exerting pressure on this structure to soften the resin and to generate foams in the unfoamed member, the unfoamed member can be subjected to the same heat treatment as the other covering materials, and therefore can be formed as one body with the other covering materials. As a result, a solar cell module is obtained that is resistant to peeling of the foamed member from an insulating film, which often occurs when using the conventional method of bonding.

According to another aspect, the present invention which achieves the above-described object relates to a method for manufacturing a solar cell module including the steps of (i) laminating a member elastically deformable in the direction of the thickness, a back-surface covering material, a photovoltaic cell, a surface covering material, a member elastically deformable in the direction of the thickness, and a member having a flexural rigidity onto a plate of a vacuum laminator, in this sequence, (ii) mounting a flexible lid member on this structure, (iii) evacuating a space between the plate and the lid member to form a vacuum, and (iv) heating the entire structure.

The foregoing and other objects, advantages and features of the present invention will become more apparent from the following description of the preferred embodiments taken in conjunction with the accompanying drawings.

DESCRIPTION OF THE PREFERRED EMBODIMENTS

Figure 1:
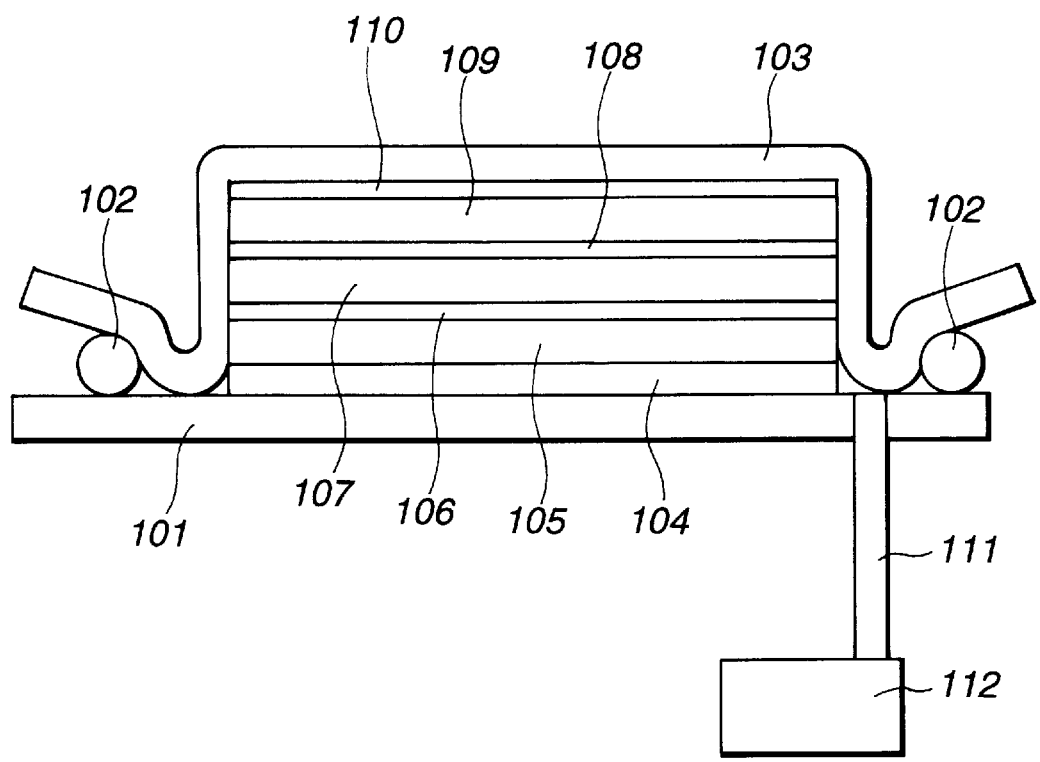
FIG. 1 is a schematic diagram illustrating a method for manufacturing a solar cell module according to an embodiment of the present invention.

FIG. 1 is a schematic diagram illustrating a method for manufacturing a solar cell module according to an embodiment of the present invention. Although various covering apparatuses may be used in the present invention, FIG. 1 shows an example of using a single vacuum method.

In FIG. 1, there are shown a laminator plate 101, an O-ring 102, a lid member 103 made of silicone rubber, a member 104 having a flexural rigidity, a member 105 elastically deformable in the direction of the thickness, a back-surface covering material 106, a photovoltaic cell 107, a surface covering material 108, a member 109 elastically deformable in the direction of the thickness, a member 110 having a flexural rigidity, a tube 111, and a vacuum pump 112. In the following description, a combination of the back-surface covering material and the surface covering material 108 wil be, in some cases, termed a lamination material.

The above-described members are laminated as shown in FIG. 1, and a portion surrounded by the laminator plate 101, the O-ring 102 and the lid member 103 is evacuated to form a vacuum using the vacuum pump 112. Then, a jig (including the laminator plate 101 and all of the members provided thereon (102–110)) shown in FIG. 1 is heated for a predetermined time period in an oven heated to a predetermined temperature.

Laminator plate

The laminator plate 101 serves as a base for laminating the covering materials (i.e., the lamination material) of the solar cell module, the photovoltaic cell, the materials elastically deformable in the direction of the thickness, and the members having flexural rigidities. In order to assist evacuation of the area surrounded by the laminator plate, the O-ring and the lid member, it is preferable to place a mesh on the laminator plate.

Since the above-described jig is heated within the oven, the laminator plate 101 must be heat stable at least at the temperature of a covering process. For a general covering process, a continuous-service heat stability at about 150–200° C is preferable.

The laminator plate must be nondeformable even when the portion surrounded by the laminator plate 101, the O-ring 102 and the lid member 103 is subjected to vacuum treatment using the vacuum pump 112. For example, if it is intended to suppress the deflection of the laminator plate 101 to a value equal to or less than 1 mm when the laminator plate 101 is hung from a beam, a steel plate having a thickness of at least 1.0 mm, or an aluminum plate having a thickness of at least 5 mm is preferably used as the laminator plate 101.

In a covering method in which the jig is placed and heated in an oven, it is preferable that the laminator plate 101 has an excellent heat conduction to the solar cell module.

Although not illustrated, the laminator plate 101 itself may have a heat source. That is, a heater may be mounted on or incorporated in the laminator plate 101.

When the components of the solar cell module do not include a rigid material, the laminator plate 101 is preferably rigid.

O-ring

Since the above-described jig is heated within the oven, the O-ring 102 must be heat stable at least at the temperature of the covering process. For a general covering process, a continuous-service heat stability of about 150–200° C is preferable.

Lid member

The lid member 103 comprises a flexible member made of silicone rubber or the like. Since the above-described jig is heated within the oven, the lid member 103 must be heat stable at least at the temperature of the covering process. For a general covering process, a continuous-service heat stability of about 150–200° C is preferable. Fluororubber or the like may also be used as the material for the lid member 103 instead of the silicone rubber.

Members having a flexural rigidity

The members having a flexural rigidity of the present invention are used in order to solve the problem that when foaming the unfoamed member in the covering process, the expansion of generated foams differs between portions where the photovoltaic cell is present and portions where the photovoltaic cell is absent in the solar cell module.

When the unfoamed member generates foams, the foaming agent contained in the unfoamed member generates gases. The generated gases raise the covering materials and the photovoltaic cell. At that time, while end portions of the jig are hardly raised because the lid member and the laminator plate are fixed at these portions, a central portion tends to swell due to expansion of the lid member because this portion is separated from the fixed ends. As a result, undulation is produced in the solar cell module. In order to prevent the occurrence of the undulation, the member having a flexural rigidity may have a large modulus of elasticity and a large thickness. The modulus of elasticity is preferably between 100 Pa and 5,000 Pa.

Even if the modulus of elasticity is large, the flexural rigitity becomes insufficient if the thickness is small. If the thickness is too large, a poor heat conduction will be provided, and the heat capacity will increase. Acordingly, it is more preferable that the member has a high modulus of elasticity and a small thickness.

The heat conductivity of the member is preferably high. A metallic plate is preferable as a member satisfying the above-described conditions. The thickness of the plate is preferably 0.1–5 mm. However, these conditions are not required when the member having a flexural rigidity has a heat source.

Members elastically deformable in the direction of the thickness.

The members elastically deformable in the direction of the thickness of the invention are deformed in accordance with projections and recesses present on the surface and the back surface of the photovoltaic cell. By being deformed while being pressed, the members have shapes following the shape of the photovoltaic cell, and therefore can uniformly press the covering materials. If these members are absent, only the members having a flexural rigidity and projections of the photovoltaic cell are partially pressed, thereby causing deformation and breakage of the photovoltaic cell and rupture of the materials due to the deformation of the photovoltaic cell. Since the members elastically deformable in the direction of the thickness can provide a pressure so as to follow the shape off the photovoltaic cell, it is also possible to prevent formation of defects in external appearance, such as formation of air bubbles, or the like.

It is necessary that the member elastically deformable in the direction of the thickness is thicker than projections and recesses of the photovoltaic cell. It is also necessary that the member elastically deformable in the direction of the thickness has a thickness so as to absorb projections and recesses of the photovoltaic cell. However, if the member elastically deformable in the direction of the thickness is too thick, the heat capacity becomes too large. Accordingly, the thickness of the member elastically deformable in the direction of the thickness is preferably 1–10 mm.

The member elastically deformable in the direction of the thickness is preferably heat stable such that thermal deformation at the temperature of the covering process does not occur. If thermal deformation occurs, the member cannot function as an elastic material, so that in the formed solar cell module the photovoltaic cell will be deformed or broken. Furthermore, such a thermally deformed member cannot be reused.

It is preferable that the member elastically deformable in the direction of the thickness of the invention recovers its original form when it is left at an ordinary temperature after being deformed so that it can be repeatedly used a sufficient number of times.

Particularly, the member elastically deformable suitable for the method for foaming the unfoamed member in the covering process is required to have the function of following projections and recesses of the photovoltaic cell at an initial pressing stage so as to provide a uniform pressure, and being further deformed uniformly in accordance with the pressure of gases generated when the foaming agent is decomposed, to homogenize the foamed member, and to further improve the property of filling the projections and recesses of the photovoltaic cell.

In order to provide such a function, the member elastically deformable in the direction of the thickness preferably has a compressive hardness between 0.01 and 500 kg/cm$^2$. If the compressive hardness is less than 0.01 kg/cm$^2$, the degree of elastic deformation in the direction of the thickness is large. Hence, if the thickness is small, projections of the photovoltaic cell contact the member having a flexural rigidity, thereby reducing the effect of being elastically deformed in the direction of the thickness. On the other hand, if the compressive hardness is more than 500 kg/cm$^2$, the member is not elastically deformed in the direction of the thickness, so that force is concentrated in projections and recesses of the photovoltaic cell to cause deformation and breakage of the photovoltaic cell. A chloroprene rubber foamed member or the like may be used as the member elastically deformable in the direction of the thickness.

The member elastically deformable in the direction of the thickness provided at the surface side of the photovoltaic cell preferably has a hardness larger than that of the member provided at the back surface side of the photovoltaic cell. By thus providing a difference in the value of the hardness, the problem of deformation of the photovoltaic cell that occurs when the amount of deformation of the member at the surface side is larger than that of the member at the back surface side is solved. Furthermore, since the surface of the photovoltaic cell is observed to be rather flat, a solar cell module having an excellent external appearance in obtained.

Solar cell module

The solar cell module of the present invention includes the back-surface covering material 106, including a reinforcing plate or a protective film, a foamed member and an insulator, the photovoltaic cell 107, and the surface covering material 108, including a filler and a surface film. The foamed member is obtained by foaming an unfoamed member in the covering process. In order to assist deaeration during lamination in a vacuum and to protect the photovoltaic cell, the back-surface covering material and/or the surface covering material may include a nonwoven or woven fabric.

The solar cell module including a reinforcing plate can be used in a form as integrated with a building material or as mounted on a rack via a frame. In a such a solar cell module, by providing a foamed member between the photovoltaic cell and the reinforcing plate, a function of raising the temperature of the photovoltaic cell is obtained. When a noncrystalline semiconductor is used for the photovoltaic cell, an effect of recovering photodegradation is obtained by the temperature raising function.

There are also solar cell modules which are not permanently fixed and can be moved whenever necessary. Such modules are used, for example, outdoors, where no electric power is supplied or for charging ships, cars and the like. For these uses, it is desirable that the solar cell module is flexible and light and can be folded or rounded while being stored. The back-surface covering material of such a portable solar cell module is, in some cases, placed in a severe environment. For example, the module may be dragged or walked upon while being moved. In order to protect against such an external force, a foamed member is provided at the back surface. In order to protect the foamed member, a protective film is provided on the backmost surface.

Reinforcing plate

A steel plate, a glass-fiber reinforced plastic (FRP), a hard platic, a timber or the like may be used for the reinforcing plate. In the case of a solar cell module integrated with a building material, it is possible to improve the rigidity of the module by performing bending processing of the reinforcing plate and also to fit and fix the module in a fixed member, such as a channel or the like. A steel plate or a stainless-steel plate is suitable for such processing. Since these materials are heat stable, they are favorably used as roof materials. Since the roof material is required to be dustproof and a weather-resistant, it is desirable to coat the roof material with a weather-resistant paint. When the bonding strength between the reinforcing plate and the foamed member is insufficient, an adhesive or a sticking material may be used together. It is desirable that the adhesive used in the present invention melts at an initial stage of the lamination process and is cross-linked at the end of the lamination process. An organic peroxide is used as a cross-linking agent. As a result of cross-linking, the cohesion of the resin of the adhesive increases, and destruction within the layer of the adhesive is prevented. It is also possible to form covalent bonding with the interface of the reinforcing plate in order to increase the bonding strength. An ethylene/vinyl-acetate copolymer, an ethylene/ethyl-acrylate copolymer, polyvinyl butyral, a silicone resin, an acrylic resin or the like way be used as the adhesive. An emulsion paint or the like may be used as the sticking material.

Protective film

The protective film is required to have various properties, such as being weather resistant, flexible, waterproof, gasoline or solvent resistant, capable of preventing movement of a plasticizer, and the like. More specifically, low-density polyethylene, a polyethylene copolymer, ethylene vinyl acetate where vinyl acetate is less than 30%, polyvinyl chloride containg a plasticizer, polyester, vinyl fluoride or the like may be used for the protective film. When the bonding strength between the protective film and the foamed member is insufficient, an adhesive or a sticking material may be used together as in the above-described case of the reinforcing plate. The protective film also has the function of preventing gases generated when the foaming agent decomposes from escaping.

Insulator

The insulator is bonded with the photovoltaic cell and the foamed member and has the function of improving insulation between the photovoltaic cell and the exterior environment. Other properties required for the insulator are electric insulation, mechanical strength, insulation in a wet state, and a heat resisting property.

When the bonding strength between the insulator and the photovoltaic cell or the foamed member is low, an adhesive can be used at the interface between these members. A structure obtained by integrally laminating the adhesive, the insulator and the adhesive is preferable from the viewpoint of operability.

It is desirable that the adhesive used in the present invention melts and is cross-linked at a high temperature. However, in the use in which the temperature of the module is raised only to about 80° C, the capability of cross-linking is not so important.

For example, biaxial oriented polyethylene terephthalate, nylon, a nonwoven glass-fiber or resin fabric may be used as the insulator.

Unfoamed member

The unfoamed member includes, in addition to resin, a foaming agent, a cross-linking agent, a filler and the like.

The foaming agent contained in the unfoamed member decomposes in the covering process to produce a foamed member by generating gases.

Resin of the unfoamed gabber

The resin used in the unfoamed member of the present invention is required to have a filling capability. For example, in ASTM 4-1238 revision, the criterion of flowability is represented by a melt flow rate. The resin used in the unfoamed member of the present invention preferably has a flowability of 1–400 dg/min. If the flowability is less than 1 dg/min, the flowability sufficient to fill projections and recesses on the back surface of the photovoltaic cell cannot be obtained. Although it is possible to increase the flowability by raising the temperature of the covering process, ethylene vinyl acetate or the like used as the filler for surface coverage turns yellow, thereby decreasing the conversion efficiency of the module. On the other hand, a resin having a flowability more than 400 dg/min cannot trap the gases generated from the foaming agent, so that the gases escape to the outside of the module.

The structure of foams formed by the gases generated from the foaming agent is required to be heat stable such that it is not crushed at a high temperature during the covering process for the module. Accordingly, it is preferable that the resin of the unfoamed member contains a cross-linking agent.

In addition to the property of becoming a foamed member during the covering process, the resin of the unfoamed member is required to have a bonding strength together with the insulator and the reinforcing plate. Any material satifying these conditions may be used. More specifically, natural rubber, styrene-butadiene rubber, chloroprene, ethylene propylene diene rubber, ethylene vinyl acetate, a copolymer of ethylene and acrylic ester, such as ethylene ethyl acrylate, or the like may be used.

When an adhesive is separately used, for example, polyethylene, polypropylene, polystyrene, or ABS resin may also be used. The above-described resins may, of course, be blended.

Foaming agent contained in the unfoamed member

Foaming of the unfoamed member is performed, for example, utilizing gases generated as by-products during a chemical reaction, by mixing or impregnating a low-boiling-point volatile solvent and vaporizing the solvent, by incorporating microballoons (hollow balloons), or by adding and dissolving a soluble substance. Any of these methods can be used in the present invention.

In the method of utilizing gases generated as byproducts during chemical reaction, an organic foaming agent capable of easily generating independent foams is preferable as the material for the foaming agent suitable for the present invention. The organic foaming agent is a material which decomposes by being heated to generate gases. The resin constituting the unfoamed member softens, generates foams, and then hardens to provide a foamed member.

Such foaming agents are classified into organic foaming agents and inorganic foaming agents.

Inorganic foaming agents include, for example, sodium bicarbonate, ammonium bicarbonate, ammonium carbonate, and azide compounds. Although sodium borohydride and light metals can generate gases, these materials are dangerous because, for example, the gas generating temperature is as high as 400 degrees or more, or hydrogen is generated. Inorganic foaming agents tend to generate continuous foams. Hence, when using an inorganic foaming agent in the present invention, it is necessary to prevent penetration of water into the foamed member according to waterproof processing or the like.

On the other hand, in organic foaming agents, the rate of gas generation by thermal decomposition is more suitable for the present invention. Organic foaming agents generate gases that are mostly comprised of nitrogen, and form uniform and fine single foams. Hence, organic foaming agents are preferable as forming agents in the present invention. Preferably, the organic foaming agent is a material which rapidly generates a gas under specified conditions.

When the decomposition temperature of the foaming agent greatly differs from the temperature used in the covering process for the solar cell module, a foaming aid is used in some cases.

The decomposition temperature of the foaming agent is preferably such that gases are generated while the resin softens and cross-linking reaction is in progress, i.e., preferably higher than the softening point of the resin and within a range of $-40\sim+40°$ C with respect to the hourly half-life temperature of the cross-linking agent comprising organic peroxide (to be described later). When forming the foamed member, it is preferable that cross-linking of the resin first occurs followed by the generation of gases.

The amount of addition of such a foaming agent is preferably 0.1–30 parts.

Cross-linking agent contained in the unfoamed member

In the foamed member used in a portable solar cell module, improvement in stability during the covering process, increase in the bonding strength with the insulator, and, when the foamed member is present at the backmost surface of the module, improvement in wear-resistance are required. Accordingly, it is desirable that the foamed member is cross-linked.

Cross-linking of a foamed member is generally performed according to radical cross-linking or an ion cross-linking by a reaction with a curing agent. However, radical cross-linking is preferable as a method for satisfying the above-described conditions.

Radical cross-linking methods are classified into an electron-beam cross-linking method, a radiation cross-linking method, a chemical cross-linking method and the like. Chemical cross-linking is preferably used because a handy apparatus can be used. Particularly, cross-linking using an organic peroxide is frequently used. The organic peroxide will now be described in detail.

Cross-linking using an organic peroxide is performed in such a way that free radicals generated from the organic peroxide form C—C bonds by drawing hydrogen within the resin. Thermal decomposition, redox decomposition and ion decomposition are known as methods for activating an organic peroxide. In general, thermal decomposition is frequently used.

The amount of addition of the organic peroxide is generally 0.1–5% with respect to the resin of the foamed member. The organic peroxide is often described in terms of an hourly half-life temperature. There is no particular restriction for the hourly half-life temperature of the organic peroxide used in the present invention. However, when a material having an olefin resin as a main component is used, the hourly half-life temperature is preferably 100–170° C because the compression forming temperature is about 90–150° C.

Although the relationship between the decomposition temperature of the foaming agent and the decomposition temperature of the cross-linking agent cannot be strictly provided, it is preferable that the hourly half-life temperature of the organic peroxide is higher than the decomposition temperature of the foaming agent.

Filler contained in the unfoamed member

A filler may be added to the unfoamed member as an extender or a nucleus agent for adjusting the foam expansion. By increasing the amount of the filler, it is possible to increase the number of foams and to obtain a fine foamed member. The addition of 1 weight % of the nucleus agent, at most, is sufficient to obtain a fine foam. Even if the amount of nucleus agent exceeds this value, the number of foams does not increase.

It is also possible to add extenders, which are typically inexpensive. Such materials serving as nuclei include, for example, calcium carbonate, clay, talc, magnesium oxide, zinc oxide, carbon black, silicon dioxide, titanium oxide, a mixture of resin fine particle orthoboric acid and talc, alkaline-earth-metal salts of fatty acid, citric acid, and sodium bicarbonate.

Foamed member

The above-described unfoamed member generates foams in a heating pressing process to form a foamed member. In the case of a flexible solar cell module, the foamed member has the function of protecting the back surface of the photovoltaic cell. By protecting the back surface with the foamed member, the solar cell module can float on water. In the case of such a solar cell module, foams are preferably independent foams which hardly absorb water. The above-described method using a foaming agent is suitable for forming independent foams.

The foamed member is also required to have the function of protecting the photovolaic cell from a force applied from the outside. In the case of a portable solar cell module, the module is expected to be walked on when the module is installed near the ground or to be dragged on the ground while being moved. Particularly, when the solar cell module is walked on, a force deforming the photovoltaic cell is applied from the back surface due to gravel and soil on the ground. In order to mitigate such a strain, it is effective to provide a foamed member which serves as an excellent buffer.

It is preferable that the thickness of the foamed member is larger than the size of gravel and soil. However, since a foamed member which is too thick has the above-described problems of curling and the like, the thickness of the foamed material is preferably 1–15 mm.

Photovoltaic cell

Figure 2A:
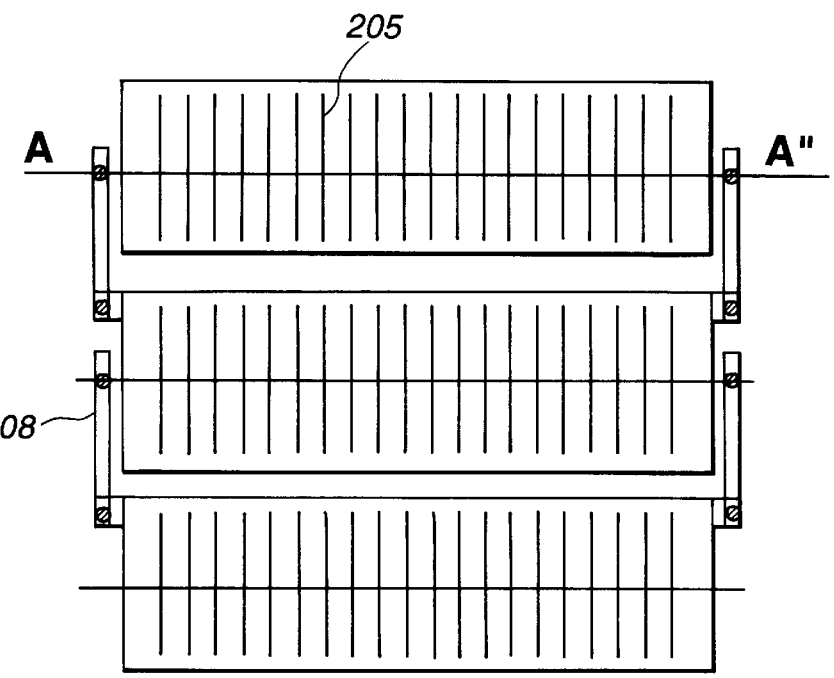
FIGS. 2(*a*) and 2(*b*), and FIG. 3 are schematic diagrams illustrating the configuration of a photovoltaic cell manufactured according to the method shown in FIG. 1.
Figure 2B:
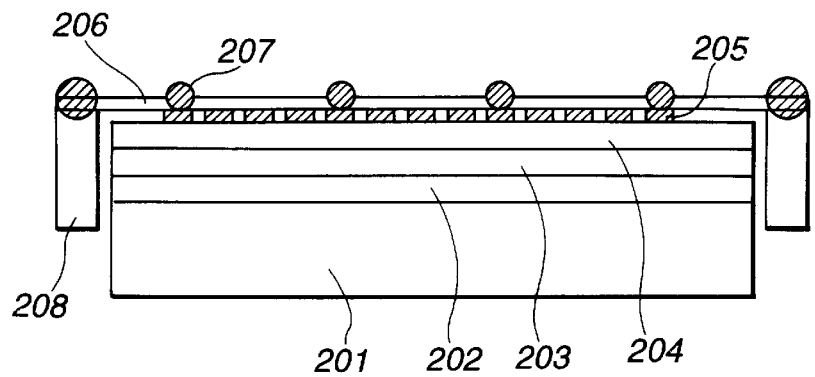
Figure 3:
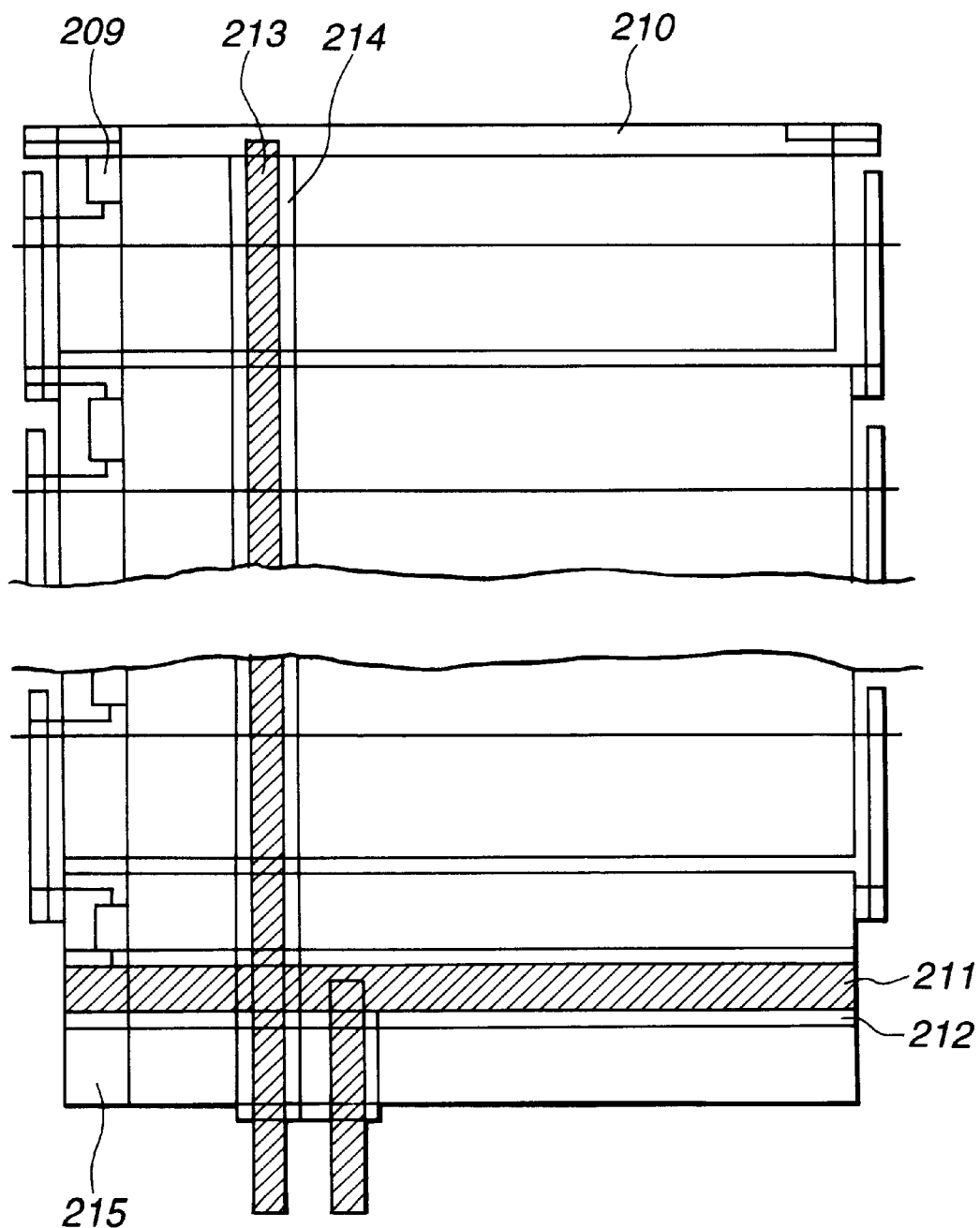

The photovoltaic cell of the present invention includes at least a semiconductor photoactive layer, serving as a photoelectric conversion member, formed on a conductive substrate, and has, for example, a configuration as shown in FIGS. 2(a) and 2(b), and FIG. 3.

In FIGS. 2(a) and 2(b), and FIG. 3, there are shown a conductive substrate 201, a back-surface reflecting layer 202, a semiconductor photoactive layer 203, a transparent conductive layer 204, and current collecting electrodes 205.

The conductive substrate 201 serves as a base of the photovoltaic cell as well as a lower electrode. For example, silicon, tantalum, molybdenum, tungsten, stainless steel, alminum, copper, titanium, a carbon sheet, a zinc-plated steel plate, or a resin film or a ceramic sheet having a conductive layer formed thereon is used as the conductive substrate 201.

A metallic layer and/or a metal oxide layer may be formed on the conductive substrate 201 as the back-surface reflecting layer 202. For example, Ti, Cr, Mo, W, Al, Ag, or Ni is used for the metallic layer, and ZnO, $TiO_2$ or $SnO_2$ is used for the metal oxide layer. The above-described metallic layer and metal oxide layer are formed according to resistance-heating vacuum deposition, electron-beam vacuum deposition, sputtering or the like.

The semiconductor photoactive layer 203 performs photoelectric conversion. More specifically, for example, pn-junction-type polycrystalline silicon, pin-junction-type amorphous silicon, or a compound semiconductor, such as $CuInSe_2$, $CuInS_2$, GaAs, $CdS/Cu_2S$, CdS/CdTe, CdS/InP, $CdTe/Cu_2Te$ or the like, is used as the material for the semiconductor photoactive layer 203. The semiconductor photoactive layer is formed, for example, according to sheet formation of fused silicon or heat treatment of noncrystalline silicon in the case of polycrystalline silicon, plasma CVD (chemical vapor deposition) using a silane gas and the like as source materials in the case of amorphous silicon, and ion plating, ion-bean deposition, vacuum deposition, sputtering, or electrodeposition in the case of a compound semiconductor.

Particularly, by using a noncrystalline semiconductor for the semiconductor layer, the semiconductor layer is annealed due to the adiabatic effect of the foamed member of the present invention, so that photodegradation in the semiconductor layer can be recovered or suppressed.

The transparent conductive layer 204 has the role of the upper electrode of the photovoltaic cell. For example, $In_2O_3$, $SnO_2$, $In_2O_3$—$SnO_2$ (ITO (indium-tin oxide)), ZnO, $TiO_2$, $Cd_2SnO_4$, or a high-density-impurity-doped cyrstalline semiconductor layer is used as the material for the transparent cnductive layer 204. The transparent conductive layer 204 is formed according to resistance-heating vacuum deposition, sputtering, spraying, CVD, impurity diffusion or the like.

In order to efficiently collect current, a grid-shaped current collecting electrode (a grid) 205 may be provided on the transparent conductive layer 204. More specifically, for example, a conductive paste obtained by dispersing fine powder of silver, gold, copper, nickel, carbon or the like in a binder polymer is used as the material for the current collecting electrode 205. A resin, such as polyester, an epoxy resin, an acrylic resin, an alkyd resin, polyvinyl acetate, rubber, urethane, phenol or the like, may be used as the binder polymer. Methods for forming the current collecting electrode 205 other than the method of using a conductive paste include sputtering using a mask pattern, resistance heating, CVD, a method of depositing a metallic film on the entire surface in a vacuum and then performing patterning by removing unnecessary portions by etching, a method of directly forming a grid electrode pattern by optical CVD, a method of performing plating after forming a negative pattern of a grid electrode pattern using a mask and then performing plating, and the like.

Finally, in order to extract the electromotive force generated, output terminals 206 are mounted to the conductive substrate 201 and the current collecting electrode 205. When mounting the output terminal 206 to the conductive substrate 201, a method of connecting a metallic member, such as a copper tab or the like, by spot welding or soldering is used. When mounting the output terminal 206 to the current collecting electrode 205, a method of electrically connecting a metallic member using a conductive adhesive or solder 207 may be used. When mounting the output terminal 206 to the current collecting electrode 205, and in order to prevent the output terminal 206 from contacting the conductive substrate 201 or the semiconductor layer 203 to cause short circuit, it is desirable to provide an insulator 208.

Photovoltaic cells manufactured in the above-described manner are connected in parallel or in series in accordance with a desired voltage or current. It is also possible to obtain a desired voltage or current by integrating photovoltaic cells on an insulated substrate.

Surface covering material

The surface covering material of the present invention includes a filler and a surface material. It is necessary that the surface covering material has the function of protecting the photovoltaic cell from external strain and the like and can sufficiently transmit light necessary for photoelectric conversion by the photovoltaic cell.

It is necessary that a resin used as the filler has excellent transparency, weather-resistant property and bondability. It is also necessary that, in order to fill projections and recesses on the surface of the photovoltaic cell, the resin has flowability in the process of manufacturing solar cell modules. For example, if the covering process uses heat and pressure, a thermoplastic resin may be used as the filler. More specifically, an ethylene/vinyl-acetate copolymer, polyvinyl butyral, a silicone resin, an acrylic resin or the like may be used.

When the bonding strength of the filler is insufficient, the bonding strength can be increased by using a silane coupling agent or a titanate coupling agent together with the filler. It is desirable to provide the filler with a desired ultraviolet light-cut function by blending an UV absorbing agent in the above-described adhesive resin constituting the filler. An organic UV absorbing agent or an inorganic UV absorbing agent way be used as the UV absorbing agent in this case. The filler is preferably reinforced in order to increase the mechanical strength. More specifically, it is preferable to insert a nonwoven glass-fiber or organic fabric during the covering process or to mix in advance, a filler comprising glass short fibers, glass beads or the like, in the resin of the filler.

It is important that the surface material is stable against heat, light and water (i.e., having excellent weather resistance). It is also desirable that the surface material is hardly stained so as to prevent a decrease in the efficiency of the photovoltaic cell due to stain. For that purpose, it is desirable that the surface material is water repellent. In order to provide the surface material with a water-repellent property, it is desirable that the contact angle with water is at least 50 degrees, and more preferably, at least 70 degrees. The surface material comprises a fluororesin or a silicone resin. Preferably, the surface material comprises a fluororesin. For example, ETFE (ethylene tetrafluoroethylene copolymer), PFA (tetra fluoroethylene perfluoro alkoxy vinyl ethers copolymer), FEP (tetrafluoroethylene hexafluoropropylene or the like may be used as the fluororesin.

The surface material comprising the above-described resin is preferably subjected to corona discharge processing, ozone processing, or coating of a primer in order to improve the bonding strength with the filler. It is also possible to use glass coated with a fluororesin or the like as the surface material.

EXAMPLES

The present invention will now be described in detail using illustrating examples. However, the present invention is not limited to these examples.

Example 1

In Example 1, an amorphous silicon (hereinafter abbreviated as an "a-Si") solar cell having the layer structure shown in FIGS. 2(a) and 2(b), and FIG. 3 was manufactured as a photovoltaic cell, and a solar cell module shown in FIG. 4 was formed using this solar cell.

Figure 4:
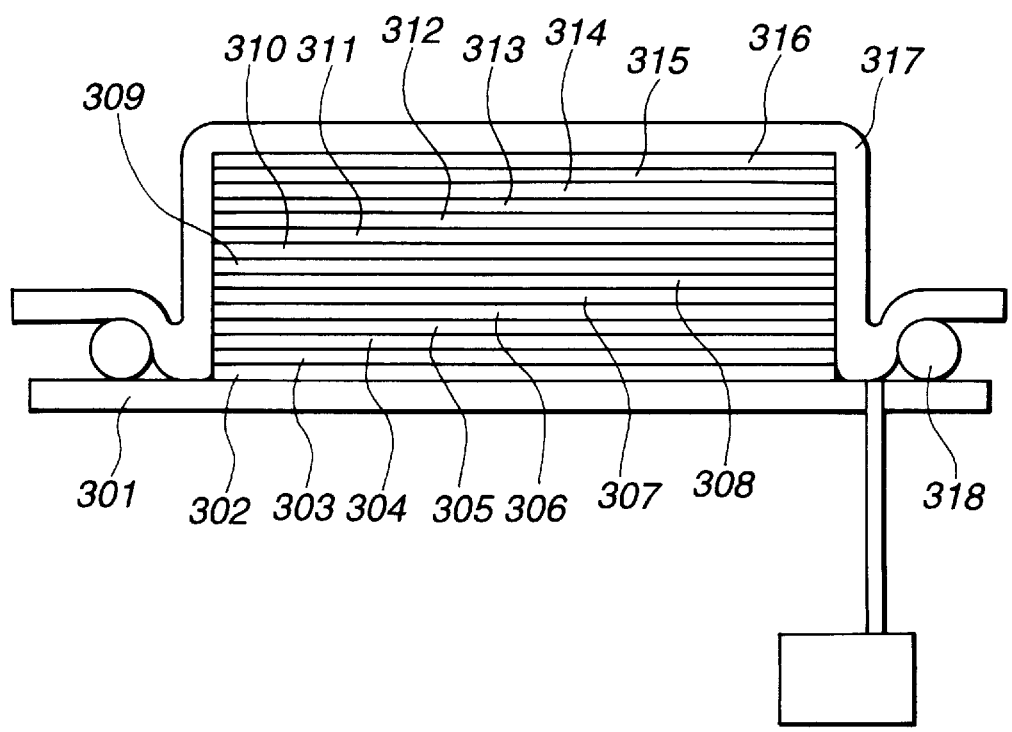
FIG. 4 is a schematic diagram illustrating a method for manufacturing a solar cell module according to another embodiment of the present invention.

As shown in FIG. 4, the solar cell module of Example 1 was manufactured by first preparing a member 302 elastically deformable in the direction of the thickness, an embossed sheet 303, a back-surface film 304, a nonwoven fabric 305, an unfoamed member 306, an insulator 307, a filler 308, a nonwoven fabric 309, a photovoltaic cell 310, a nonwoven fabric 311, a filler 312, a surface film 313, an embossed sheet 314, a member 315 elastically deformable in the direction of the thickness, and a member 316 having a flexural rigidity on a laminator plate 301, and laminating these members.

The contents of each of the members will now be described in detail.

Back-surface film

A polyethylene film (low density, 30 $\mu$m thick) was used as the back-surface film 304.

Filler

Each of the filler 308 of the back-surface covering material and the filler 312 of the surface covering material was a mixture of 100 weight parts of ethylene vinyl acetate (33 weight % of vinyl acetate, a melt flow rate of 30), 1.5 weight parts of 5-dimethyl-2,5-bis (t-butylperoxy) hexane as a cross-linking agent, 0.3 weight parts of 2-hydroxy-4-n-octyloxybenzophenone as a UV absorbing agent, 0.2 weight parts of tris(mono-nonyl phenyl) phosphite as an antioxidant, and 0.1 weight parts of bis(2,2,6,6-tetramethyl-4-piperidinyl) sebacate as a photostabilizer manufactured using a T die and an extruder.

The thickness of the filler 308 of the back-surface covering material was 230 $\mu$m, and the thickness of the filler 312 of the surface covering material was 460 $\mu$m.

Unfoamed member

The unfoamed member 306 was prepared in the following manner.

A mixture of 100 weight parts of an ethylene-vinyl acetate resin (15 weight % of vinyl acetate, a melt flow rate of 9 dg/min), 40 weight parts of light calcium carbonate (a primary particle size of about 3 $\mu$m) as a nucleus agent, 5 weight parts of a mixture of azodicarbosoamide and dinitrosopentamethylenetetramine as a foaming agent, 1 weight part of dicumylperoxide as a cross-linking agent, 0.5 weight parts of stearic acid, and 0.1 weight parts of carbon black as a pigment was formed into a sheet of 1.5 mm thick using inverted-L-type four calenders.

Insulator

A biaxial-oriented polyethylene terephthalate film (50 $\mu$m thick) subjected to corona processing for both surfaces was used as the insulator 307. The processed surface had a wetting index of at least 53 dyne/cm.

Nonwoven fabric

An organic nonwoven fabric made of polypropylene (a weighing of 20 g/m$^2$, an average fiber diameter of 15 $\mu$m, an apparent thickness of 130 $\mu$m, containing 3% of poly[{6-1,1,3,3-tetramethylbutyl)amino-1,3,5-triadine-2,4 diyr}{2,2,6,6-(tetramethyl-4-piperidinyl)imino}hexamethylene {(2,2,6,6-tetramethyl-4-piperidinyl)imino}] was used as the nonwoven fabric 305 provided at the lower side of the back surface.

A nonwoven glass fiber fabric (a fiber diameter of 10 $\mu$m, a weighing of 20 g/m$^2$, E glass, a glass-fiber diameter of 6 $\mu$m, 5% of acrylic binder) was prepared as the nonwoven fabric 309 provided under the photovoltaic cell.

A nonwoven glass fiber fabric (a fiber diameter of 10 $\mu$m, a weighing of 80 g/m$^2$, E glass, a glass-fiber diameter of 6 $\mu$m, 5% of acrylic binder) was prepared as the nonwoven fabric 311 provided above the photovoltaic cell.

Photovoltaic cell

The photovoltaic cell having the configuration shown in FIGS. 2(a) and 2(b), and FIG. 3 manufactured in the following procedures was used as the photovoltaic cell 310.

(1) First, a cleaned stainless-steel substrate 201 having the shape of a belt was prepared. An Al layer (500 nm thick) and a ZnO layer (500 nm thick) were sequentially formed on the substrate 201 according to sputtering as the back-surface reflecting layer 202.

(2) Then, a tandem amorphous-silicon photoelectric-conversion semiconductor layer comprising an n-type layer (15 nm thick)/an i-type layer (400 nm thick)/a p-type layer (10 nm thick)/an n-type layer (10 nm thick)/an i-type layer (80 nm thick)/an p-type layer (10 nm thick) was formed using plasma CVD to provide the semiconductor photoactive layer 203.

The n-type layer indicates an n-type amorphous-silicon (a-Si) layer formed using a mixture gas of $SiH_4$, $PH_3$ and $H_2$. The i-type layer indicates an i-type amorphous-silicon (a-Si) layer formed using a mixture gas of $SiH_4$ and $H_2$. The p-type layer indicates a p-type microcrystalline-silicon ($\mu c$-Si) layer formed using a mixture gas of $SiH_4$, $BF_3$ and $H_2$.

(3) An $In_2O_3$ thin film (700 nm thick) was formed by depositing In by resistance heating in an $O_2$ atmosphere as the transparent conductive layer 204.

(4) The samples obtained in the above-described processes (1)–(3) were cut and then subjected to etching according to screen printing, to provide a plurality of cells having a size of 30 cm×9 cm.

(5) 13 samples were selected from among the obtained plurality of cells, and the grid electrodes 205 for collecting current were formed on each of the samples according to screen printing using a silver paste (product number: #5007 made by DuPont Corp.).

(6) The collecting electrodes 205 were bonded and connected to each other using a wire bus bar 206 (a diameter of a solder-plated copper wire of 400 $\mu m$) and a silver paste 207 (product number: #220 made by Amicon Company).

(7) A copper tab 208 (100 $\mu m$ thick) was mounted on the stainless-steel substrate 201 according to spot welding to provide each photovoltaic cell.

(8) The thirteen photovoltaic cells obtained were connected in series by soldering the copper tab 208 of each photovoltaic cell to the wire bus bar 206 of the adjacent photovoltaic cell.

(9) A bypass diode 209 (having a diameter of 2.5 mm) was mounted on the back surface of each photovoltaic cell via an insulating tape (140 $\mu m$ thick comprising a polyethylene terephthalate base 100 $\mu m$ thick and a sticking material 40 $\mu m$ thick) 215, and was connected to the positive electrode and the negative electrode of the photovoltaic cell by soldering.

(10) The same insulating tape was applied on the bypass diode. A copper tab 210 for negative electrode output and a copper tab 211 (100 $\mu m$ thick) for positive electrode output were mounted on the photovoltaic cell at respective ends of the group of the photovoltaic cells connected in series via a double coated tape (65 $\mu m$ thick) and an insulating tape 212 (140 $\mu m$ thick comprising a polyethylene terephthalate base 100 $\mu m$ thick and a sticking material 40 $\mu m$ thick), respectively.

(11) The copper tab 208 of the photovoltaic cell at one end was soldered to the copper tab 210 (100 $\mu m$ thick) for negative electrode output. The wire bus bar of the photovoltaic cell at the other end was folded and soldered to the copper tab 211 for positive electrode output.

(12) In order to provide a one-side output terminal, the copper tab. 213 was soldered to the copper tab 210 for negative electrode output and was extended, and was bonded on the photovoltaic cell via an insulating tape 214 (140 $\mu m$ thick comprising a polyethylene terephthalate base 100 $\mu m$ thick and a sticking material 40 $\mu m$ thick). A positive electrode output terminal was provided in the same manner.

According to the above-described processes (1)–(12), the photovoltaic cell 310 used in Example 1 was prepared.

Surface film

An unoriented ethylene-tetrafluoroethylene film (50 $\mu m$ thick) was prepared as the surface film 313. Corona discharge processing was preformed in advance on a bonding surface with the filler 307.

Embossed sheet

A chopped-strand mat (a weighing of 450 $g/m^2$, a diameter of fibers of 17 $\mu m$, a number of secondary fiber bundles of 400 mm, a fiber length of 100 mm) was used as the embossed sheet 303 at the back-surface film side. In order to prevent stain in the embossed sheet due to the flow of the filler, a PFA sheet was used together.

An organic unwoven fabric (polyester resin, a diameter of fibers of 20 $\mu m$, and a weighing of 20 $g/m^2$) was used as the embossed sheet 314 at the surface film side.

Members elastically deformable in the direction of the thickness

A chloroprene-rubber foamed member (a compressive hardness, conforming to JIS (Japanese Industrial Standards) K6767, of 50, 8.0 mm thick, an expansion of generated foams of 30) was used as the member 302 elastically deformable in the direction of the thickness, at the back-surface film side.

A silicone rubber (a compressive hardness conforming to JIS K6767 of 70, 2 mm thick) was prepared as the member 315 elastically deformable in the direction of the thickness at the surface film side.

Members having A flexural rigidity

The laminator aluminum plate (a modulus of elasticity of $7.0 \times 10^{10}$ Pa, 8 mm thick) having a flexural rigidity 301 was also used as the member having a flexural rigidity at the back-surface film side.

A steel plate (a modulus of elasticity of $20 \times 10^{10}$ Pa, 0.8 mm thick) was prepared as the member 316 having a flexural rigidity at the surface film side.

A method for manufacturing a solar cell module by covering the photovoltaic cell with the above-described members will now be described.

First, a PFA film (50 $\mu m$ thick, not shown) was placed at a predetermined position of the laminator, which uses the aluminum plate 301 as the plate, in order to prevent stain.

The member 302 elastically deformable in the direction of the thickness, the embossed sheet 303, the back-surface film 304, the nonwoven fabric 305, the unfoamed member 306, the insulator 307, the filler 308, the nonwoven fabric 309, the photovoltaic cell 310, the nonwoven fabric 311, the filler 312, the surface film 313, the embossed sheet 314, the member 315 elastically deformable in the direction of the thickness, and the member 316 having a flexural regidity were stacked in this sequence to provide a laminated member, and a sheet made of heat resistant silicone rubber (a compressive hardness conforming to JIS K6767 of 70, 2 mm thick) was mounted on the laminated member as the lid member 317.

Then, the pressure of the inside of the laminator was, reduced to 2 Torr by a vacuum pump using the O-ring 318 as a sealing material. After evacuating the inside of the laminator for 30 minutes, the laminator was placed within a hot-air drying furnace maintained at 120° C., and was taken out after 100 minutes. Then, the laminator was cooled to the room temperature while evacuating the inside of the laminator. The vacuum was maintained at a value equal to or less than 4 Torr until cooling was completed.

Thus, a plurality of photovoltaic cell modules were manufactured.

A description will now be provided of four evaluation items, i.e., initial appearance, an electric insulation test, a wear resistance test, and a temperature/humidity cycle test, for the manufactured photovoltaic cell modules.

Results of the evaluation are shown in Table 1.

Initial appearance

Initial appearance of the solar cell modules obtained after passing through the covering process was evaluated.

Three portions, i.e., the surface covering material, the photovoltaic cell, and the back-surface covering material, were observed, and were evaluated according to the following criteria:

A: A sample in which peeling of surface coverage, remainder of foams, undulation of the module, deformation and breakage of the photovoltaic cell caused by projections and recesses on the back surface of the photovoltaic cell are not observed at a distance of 1 m.

B: A sample in which, while deformation of the photovoltaic cell caused by projections and recesses on the back surface of the photovoltaic cell is observed, the amount of deformation is less than 0.2 mm.

C: A sample in which peeling of surface coverage, remainder of foams, depressions in the foamed member at the back surface, deformation and breakage of the photovoltaic cell caused by projections and recesses on the back surface of the photovoltaic cell are observed, and the amount of deformation is at least 0.2 m.

Electric insulation test

A high-voltage dielectric breakdown test was performed for the solar cell modules manufactured passing through the covering process. The high-voltage dielectric breakdown test will now be described.

(1) First, the anode and the cathode of the photovoltaic cell were short-circuited.

(2) The obtained sample was immersed in a solution (containing 1 weight % of Triton X-100 (product name: made by Rohm & Haas Corp.) as a surface-active agent) having an electric conductivity of at least 3,500 ohm·co. At that time, a portion where the above-described load was applied was immersed in the solution without immersing the output terminal of the sample in the solution.

(3) The cathode of a power supply was immersed in the solution, and the anode of the power supply was connected to the output terminal of the sample.

(4) A voltage of 2,200 V was applied from the power supply, and a leakage current at that time was measured.

The evaluation in this test is expressed by A when the leakage current is equal to or less than 50 $\mu$A, and by C when the leakage current exceeds 50 $\mu$A.

Wear resistance test

The wear resistance test is a test of whether or not the protective property of the surface covering material of the solar cell module is resistant against scratching from the outside. In this test, the surface of the solar cell module is scratched with a steel blade while applying a load on the blade at a speed of 152.4 mm/sec.

As an evaluation in this test, the above-described high-voltage dielectric breakdown test was performed after performing the above-described scratching. The result of the evaluation was represented by the maximum load of the blade when the leakage current does not exceed 50 $\mu$A.

Temperature/humidity cycle test

After repeating 20 cycles of a temperature/humdity cycle test including setting 1 (−40° C./1 hour) and setting 2 (85° C./85% RH/4 hours) for the photovoltaic cell module, external appearance of the photovoltaic cell module was visually evaluated. At that time, visual evaluation of external appearance was performed based on the following criteria:

A: A sample having no change in external appearance.

B: A sample whose external appearance is more or less changed, or in which peeling of the inside of the sample could be confirmed by touching, or in which peeling could be confirmed by disassembling the module.

C: A sample in which peeling could be confirmed.

Furthermore, the rate of change in the shunt resistance of the solar cell module was checked. In this case, the current value at a forward bias voltage of 0.4 V per slab of the module in a dark state was defined as the shunt resistance. The rate of change is represented by a percent value obtained by dividing the value of the shunt resistance after the test by the value of the shunt resistance before the test.

Example 2

Example 2 differs from Example 1 in that the member 315 elastically deformable in the direction of the thickness at the surface side and the member 302 elastically deformable in the direction of the thickness at the back-surface side were inversely disposed in the direction of lamination. A plurality of photovoltaic cell modules were manufactured, by using the same structure as in Example 1 except the above-described difference. Then, the obtained samples were evaluated in the same manner as in Example 1.

Example 3

Example 3 differs from Example 1 in that the nonwoven fabric 315 present at the lower side of the back surface was not used. A plurality of photovoltaic cell modules were manufactured by using the same structure as in Example 1 except the above-described difference. Then, the obtained samples were evaluated in the same manner as in Example 1.

Example 4

Example 4 differs from Example 1 in that the filler 312 of the surface covering material was used instead of the unfoamed member 306. A plurality of photovoltaic cell modules were manufactured by using the same structure as in Example 1 except the above-described difference. Then, the obtained samples were evaluated in the same manner as in Example 1.

Example 5

Example 5 differs from Example 1 in that a color steel plate (a galvanized steel plate, a weight of plating on both surfaces of 150 g/m$^2$, a product of double coating operations and double baking operations, a polyester resin being used as a paint on the outermost layer of the weather resistant surface) was used instead of the member 302 elastically deformable in the direction of the thickness, the embossed sheet 303, the back-surface film 304 and the nonwoven fabric 305. A plurality of photovoltaic cell modules was manufactured by using the same structure as in Example 1 except for the above-described difference. Then, the obtained samples were evaluated in the same manner as in Example 1.

Comparative Example 1

This example differs from Example 1 in that both of the members 302 and 315 elastically deformable in the direction of the thickness was not used. A plurality of photovoltaic cell modules were manufactured by using the same structure as in Example 1 except the above-described difference. Then, the obtained samples were evaluated in the same manner as in Example 1.

Comparative Example 2

This example differs from Example 1 in that the member 316 having a flexural rigidity was not used, A plurality of photovoltaic cell modules were manufactured by using the same structure as in Example 1 except for the above-described difference. Then, the obtained samples were evaluated in the same manner as in Example 1.

Comparative Example 3

This example differs from Example 5 in that the member 315 elastically deformable in the direction of the thickness was not used. A plurality of photovoltaic cell nodules were manufactured by using the same structure as in Example 5 except the above-described difference. Then, the obtained samples were evaluated in the same manner as in Example 1.

TABLE 1

| | Initial appearance | | | | |
|---|---|---|---|---|---|
| | Surface covering material | Photo-voltaic cell | Back-surface covering material | Electric insulation | Wear resistance |
| Example 1 | A | A | A | A | 6 |
| Example 2 | A | A | A | A | 6 |
| Example 3 | A | A | B | A | 6 |
| Example 4 | A | A | A | A | 6 |
| Example 5 | A | A | A | A | 6 |
| Comparative Example 1 | C | C | A | C | 2 |
| Comparative Example 2 | C | A | A | A | 6 |
| Comparative Example 3 | C | C | A | A | 2 |

| | Temperature/humidity cycle test | | | |
|---|---|---|---|---|
| | External appearance | | | |
| | Surface covering material | Photovol-taic cell | Back-surface covering material | Shunt resistance |
| Example 1 | A | A | A | A |
| Example 2 | A | A | A | A |
| Example 3 | A | A | A | A |
| Example 4 | A | A | A | A |
| Example 5 | A | A | A | A |
| Comparative Example 1 | A | A | A | C |
| Comparative Example 2 | A | A | A | A |
| Comparative Example 3 | A | A | A | C |

From Table 1, it has become clear that by using the members having a flexural rigidity and the members elastically deformable in the direction of the thickness, the solar cell module according to the present invention has an excellent initial external appearance and high electric insulation. It has also been confirmed that the solar cell module has an excellent resistance against damage caused from the outside and high reliability, because the photovoltaic cell is not deformed by providing the members elastically deformable in the direction of the thickness. In the method of foaming the unfoamed member in the covering process, by utilizing the property of the member elastically deformable in the direction of the thickness that the hardness changes in accordance with the amount of deformation, a uniform foamed member was obtained. The filling property of the foamed member for projections and recesses of the photovoltaic cell could also be improved.

As described above, according to the present invention, a method is provided for manufacturing a solar cell module, in which, even when covering a photovoltaic cell having projections and recesses, deformation and breakage of the photovoltaic cell, rupture of covering materials, and the like do not occur, undulation of the solar cell module due to nonuniformity in the expansion of generated foams of a foamed member is very small, and formation of defects in the external appearance due to nonuniform foaming does not occur.

The individual components shown in outline in the drawings are all well-known in the solar cell module manufacturing method arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for manufacturing a solar cell module providing a photovoltaic cell between a surface covering material and a back-surface covering material, said method comprising the steps of:

sequentially laminating a member elastically deformable in the direction of the thickness and a member having a flexural rigidity, on at least one of the surface covering material or the back-surface covering material; and providing an external pressure to the member having the flexural rigidity to cover the photovoltaic cell with the surface covering material and the back-surface covering material.

2. A method according to claim 1, wherein a reinforcing plate or a back-surface film is disposed at the backmost surface of the back-surface covering material, wherein an unfoamed member including a resin and a foamed member is disposed between the reinforcing plate or the back-surface film and the photovoltaic cell, and wherein the unfoamed member is foamed by softening the resin by being simultaneously heated in said pressure providing process.

3. A method according to claim 1, wherein means for providing the pressure is vacuum pressurization.

4. A method according to claim 1, wherein a relationship of $A \geq B$ holds, where A is a compressive hardness of the member elastically deformable in the direction of the thickness provided outside the surface covering material, and B is a compressive hardness of the member elastically deformable in the direction of the thickness provided outside the back-surface covering material.

5. A method according to claim 1, wherein a woven fabric or a nonwoven fabric is provided within at least one of the back-surface covering material or the surface-covering material.

6. A method according to claim 1, wherein the photovoltaic cell includes a noncrystalline semiconductor.

7. A method for manufacturing a solar cell module comprising the steps of:

laminating a member elastically deformable in the direction of the thickness, a back-surface covering material, a photovoltaic cell, a surface covering material, a member elastically deformable in the direction of the thickness, and a member having a flexural rigidity on a plate of a vacuum laminator, in this sequence to form a solar cell structure;

mounting a flexible lid member on the structure;

evacuating a space between the plate and the lid member to form a vacuum; and heating the structure.

8. A method according to claim 7, wherein a reinforcing plate or a back-surface film is provided at the backmost surface of the back-surface covering material, wherein an unfoamed member including a resin and a foamed member is provided between the reinforcing plate or the back-surface film and the photovoltaic cell, and wherein the unfoamed member is foamed by softening the resin by being simultaneously heated in a pressure providing process.

9. A method according to claim 7, wherein a relationship of $A \geq B$ holds, where A is a compressive hardness of the member elastically deformable in the direction of the thickness provided outside the surface covering material, and B is a compressive hardness of the member elastically deformable in the direction of the thickness provided outside the back-surface covering material.

10. A method according to claim 7, wherein a woven fabric or a nonwoven fabric is provided within at least one of the back-surface covering material or the surface-covering material.

11. A method according to claim 7, wherein the photovoltaic cell includes a noncrystalline semiconductor.

* * * * *

UNITED STATES PATENT AND TRADEMARK OFFICE
CERTIFICATE OF CORRECTION

PATENT NO.    : 6,113,718
DATED         : September 5, 2000
INVENTOR(S)   : Satoru Yamada et al.

It is certified that error appears in the above-identified patent and that said Letters Patent is hereby corrected as shown below:

<u>Title page,</u>
Insert -- [30] Foreign Application Priority Data
                January 6, 1997   [JP] Japan……………………………..9-000090 --.

<u>Column 1,</u>
Line 50, "In" should read -- ¶ In --.

<u>Column 3,</u>
Line 18, "flow of the resin" should read -- resin flow --;
Line 59, "tb" should read -- to --.

<u>Column 5,</u>
Line 34, "has" should read -- have --.

<u>Column 6,</u>
Lines 14 and 44, "has" should read -- have --;
Line 41, "is" should read -- be --.

<u>Column 7,</u>
Line 59, "is" should read -- be --.

<u>Column 8,</u>
Line 11, "a" should be deleted;
Line 17, "melts" should read -- melt --;
Line 26, "way" should read -- may --.

<u>Column 9,</u>
Line 4, "gabber" should read -- member --;
Line 53, "foams" should read -- foam --.

<u>Column 10,</u>
Line 6, "forming" should read -- foaming --;
Lines 32 and 66, "is" should read -- be --.

UNITED STATES PATENT AND TRADEMARK OFFICE
CERTIFICATE OF CORRECTION

PATENT NO. : 6,113,718
DATED : September 5, 2000
INVENTOR(S) : Satoru Yamada et al.

It is certified that error appears in the above-identified patent and that said Letters Patent is hereby corrected as shown below:

Column 11,
Line 10, "inexpensive." should read -- inexpensive materials. --;
Line 39, "is" should read -- be --.

Column 12,
Line 13, "ion-bean" should read -- ion-beam --;
Line 24, "cyrstalline" should read -- crystalline --;
Line 26, "cnductive" should read -- conductive --.

Column 13,
Lines 4, 8 and 11, "has" should read -- have --;
Line 25, "way" should read -- may --;
Lines 32, 34 and 39, "is" (second occurrence) should read -- be --;
Line 37, "is" should read -- be --.

Column 14,
Line 50, "poly[{6-1," should read -- poly[{6-(1, --;
Line 51, "2,4 diyr} {2,2," should read -- 2,4-diyl}{2,2, --;
Line 66, "in" should read -- by --.

Column 15,
Lines 16 and 18, "mixture gas" should read -- gaseous mixture --;
Line 64, "tab." should read -- tab --;
Line 65, "output and was extended," should read -- output, was extended --.

Column 16,
Line 24, "K6767, of" should read -- K6767 of --;
Line 53, "regidity" should read -- rigidity --;
Line 59, "was," should read -- was --.

Column 17,
Line 6, "modules." close up right margin;
Line 7, "Results" close up left margin;
Line 10, "evaluated." close up right margin;
Line 11, "Three" close up left margin;
Line 29, "0.2 m." should read -- 0.2 mm. --;
Line 40, "ohm•co." should read -- ohm•cm. --.

UNITED STATES PATENT AND TRADEMARK OFFICE
CERTIFICATE OF CORRECTION

PATENT NO.   : 6,113,718
DATED        : September 5, 2000
INVENTOR(S)  : Satoru Yamada et al.

It is certified that error appears in the above-identified patent and that said Letters Patent is hereby corrected as shown below:

<u>Column 18,</u>
Line 1, "external" should read -- the external --;
Lines 57 and 67, "was" should read -- were --.

<u>Column 19,</u>
Line 17, "nodules" should read -- modules --.

Signed and Sealed this

Thirteenth Day of May, 2003

JAMES E. ROGAN
*Director of the United States Patent and Trademark Office*